United States Patent
Jiang et al.

(10) Patent No.: US 10,085,305 B2
(45) Date of Patent: Sep. 25, 2018

(54) ELECTROMAGNETIC HEATING DEVICE AND HEATING CONTROL CIRCUIT THEREOF, AND LOW POWER HEATING CONTROL METHOD

(71) Applicant: FOSHAN SHUNDE MIDEA ELECTRICAL HEATING APPLIANCES MANUFACTURING CO., LIMITED, Foshan (CN)

(72) Inventors: Deyong Jiang, Foshan (CN); Yunfeng Wang, Foshan (CN); Lutian Zeng, Foshan (CN)

(73) Assignee: FOSHAN SHUNDE MIDEA ELECTRICAL HEATING APPIANCES MANUFACTURING CO., LTD., Foshan (CN)

( * ) Notice: Subject to any disclaimer, the term of this patent is extended or adjusted under 35 U.S.C. 154(b) by 0 days.

(21) Appl. No.: 15/921,396

(22) Filed: Mar. 14, 2018

(65) Prior Publication Data

US 2018/0206294 A1    Jul. 19, 2018

Related U.S. Application Data

(63) Continuation of application No. PCT/CN2016/084172, filed on May 31, 2016.

(30) Foreign Application Priority Data

Feb. 2, 2016   (CN) .......................... 2016 1 0074432
Feb. 2, 2016   (CN) ..................... 2016 2 0106928 U

(51) Int. Cl.
  *G02F 1/1343*   (2006.01)
  *G02F 1/1337*   (2006.01)
  (Continued)

(52) U.S. Cl.
  CPC ............ *H05B 6/062* (2013.01); *H03K 5/1536* (2013.01); *H03K 17/567* (2013.01); *H05B 2206/02* (2013.01)

(58) Field of Classification Search
  CPC ........ G02F 1/133707; G02F 1/134336; G09G 3/3674; G09G 3/3677; G09G 2300/0426; G09G 2310/08; G09G 2320/0214
  (Continued)

(56) References Cited

FOREIGN PATENT DOCUMENTS

| CN | 101048019 A | 10/2007 |
|---|---|---|
| CN | 201323669 Y | 10/2009 |
| CN | 202425086 U | 9/2012 |

OTHER PUBLICATIONS

Midea, International Search Report and Written Opinion, PCT/CN2016/084172, dated Nov. 8, 2016, 8 pgs.

*Primary Examiner* — Eric Stapleton
(74) *Attorney, Agent, or Firm* — Morgan, Lewis & Bockius LLP

(57) ABSTRACT

Disclosed are an electromagnetic heating device and a heating control circuit thereof, and a low power heating control method. The heating control circuit comprises: a voltage zero-crossing detection unit for detecting a voltage zero-crossing signal of an alternating current power source; a resonance heating unit; a rectification and filtering unit; a power switch tube; a drive unit, connected to a drive end of the power switch tube to drive the power switch tube to be turned on and off; a drive voltage transformation unit, connected to the drive end of the power switch tube to change a drive voltage of the power switch tube; and a main control unit for controlling the power switch tube to operate under the drive of a first drive voltage according to the voltage zero-crossing signal, thereby reducing the damage risk of the power switch tube and reducing turn-on noises.

16 Claims, 4 Drawing Sheets

(51) Int. Cl.
  *G09G 3/36* (2006.01)
  *H05B 6/06* (2006.01)
  *H03K 5/1536* (2006.01)
  *H03K 17/567* (2006.01)
(58) Field of Classification Search
  USPC .......................................................... 219/664
  See application file for complete search history.

ELECTROMAGNETIC HEATING DEVICE AND HEATING CONTROL CIRCUIT THEREOF, AND LOW POWER HEATING CONTROL METHOD

PRIORITY CLAIM AND RELATED APPLICATION

This application is a continuation application of PCT/CN2016/084172, entitled "ELECTROMAGNETIC HEATING DEVICE AND HEATING CONTROL CIRCUIT THEREOF, AND LOW POWER HEATING CONTROL METHOD" filed on May 31, 2016, which claims priority to (i) Chinese Patent Application No. 201610074432.6, filed with the State Intellectual Property Office of the People's Republic of China on Feb. 2, 2016, and (ii) Chinese Patent Application No. 201620106928.2, filed with the State Intellectual Property Office of the People's Republic of China on Feb. 2, 2016, all of which are incorporated herein by reference in their entirety.

TECHNICAL FIELD

The present disclosure relates to an electromagnetic heating technology field, and more particularly to a heating control circuit of an electromagnetic heating apparatus, a low power heating control method of an electromagnetic heating apparatus and an electromagnetic heating apparatus.

BACKGROUND

At present, an electromagnetic resonance circuit with a single insulated gate bipolar transistor (IGBT for short) generally adopts a parallel resonance mode, and when resonance parameters for realizing a high power operation of an electromagnetic oven are used, there may be following problems if the electromagnetic oven continuously operates at a range of low power.

(1) The IGBT is turned on with a leading voltage, and a high instant current peak value may be caused at the moment of the IGBT is turned on, which is likely to exceed a specification limit of the current peak value of the IGBT, thus damaging the IGBT.

(2) The IGBT may emit heat greatly, and it is required to strengthen heat dissipation (such as to enlarge cooling fins, to improve the rotate speed of the fan) of the IGBT, so as to satisfy a temperature rise demand of the IGBT.

(3) If the low power is realized under a duty ratio heating mode, i.e. if a discontinuous heating mode is used, there is a hard turn-on phenomenon when the IGBT turns on in a next period because of the existence of a filter capacitor, which is likely to damage the IGBT.

SUMMARY

Embodiments of the present disclosure seek to solve at least one of the problems existing in the related art to at least some extent. Accordingly, a first objective of the present disclosure is to provide a heating control circuit of an electromagnetic heating apparatus, by adding a driving and transforming unit to control a power switch transistor to perform voltage-changing turn-on when the electromagnetic heating apparatus is working, thus reducing a risk of damaging the power switch transistor, reducing noise when turning on the power switch transistor.

A second objective of the present disclosure is to provide a low power heating control method of an electromagnetic heating apparatus. A third objective of the present disclosure is to provide an electromagnetic heating apparatus.

To achieve above objectives, a first aspect of embodiments of the present disclosure provides a heating control circuit of an electromagnetic heating apparatus, including: a voltage zero-crossing detecting unit, in which the voltage zero-crossing detecting unit is configured to detect a voltage zero-crossing signal of an alternating current power source input to the electromagnetic heating apparatus; a resonance heating unit; a rectifier and filter unit, in which the rectifier and filter unit is configured to perform rectifying and filtering on the alternating current power source which is provided to the resonance heating unit; a power switch transistor configured to control the resonance heating unit to perform resonance work; a driving unit, in which the driving unit is coupled to a driving end of the power switch transistor so as to drive the power switch transistor to turn on or to turn off; a driving and transforming unit, in which the driving and transforming unit is coupled to the driving end of the power switch transistor so as to change a driving voltage of the power switch transistor; and a main control unit, in which the main control unit is coupled to the voltage zero-crossing detection unit, the driving unit, and the driving and transforming unit respectively, and the main control unit is configured to control the driving unit and the driving and transforming unit to make the power switch transistor work under a first driving voltage before a zero-crossing point of the alternating current power source judged according to the voltage zero-crossing signal, to control the driving and transforming unit to stop working when a voltage of a collector of the power switch transistor oscillates to a minimum, and to control the driving unit to make the power switch transistor work under a second driving voltage, in which the second driving voltage is larger than the first driving voltage.

With the heating control circuit of an electromagnetic heating apparatus according to the embodiments of the present disclosure, the driving and transforming unit is added to change the driving voltage of the power switch transistor, such that the main control unit controls the driving unit and the driving and transforming unit to make the power switch transistor work under the driving of the first driving voltage before the zero-crossing point of the alternating current power source judged according to the voltage zero-crossing signal, and controls the driving and transforming unit to stop working when the voltage of the collector of the power switch transistor oscillates to the minimum, and controls the driving unit to make the power switch transistor work under the second driving voltage, thus realizing starting and turn-on of the power switch transistor via a voltage-changing driving manner when the electromagnetic heating apparatus is working, reducing an open current of the power switch transistor, and reducing the damage caused by hard turn-on of the power switch transistor, meanwhile, reducing noise of turn-on, avoiding a large heating emitted from the power switch transistor, improving operation reliability of the electromagnetic heating apparatus, and broadening a range of heating power of the electromagnetic heating apparatus.

According to some embodiments of the present disclosure, a working process of the power switch transistor includes a first period and a second period, in which, in the first period, an amplitude value of the first driving voltage remains constant or increases linearly, a pulse width of the first driving voltage increases progressively or is a constant width; in the second period, an amplitude value of the second driving voltage remains constant, a pulse width of the second driving voltage increases progressively or is a constant width.

In addition, in the first period, the power switch transistor works in an amplification state; in the second period, the power switch transistor works in a switch state.

According to some embodiments of the present disclosure, the voltage of the collector of the power switch transistor oscillates to the minimum at the zero-crossing point of the alternating current power source.

According to some embodiments of the present disclosure, in the first period, the main control unit is configured to output a first control signal to the driving unit and to output a second control signal to the driving and transforming unit, such that the power switch transistor works under the first driving voltage with a constant amplitude value, and the voltage of the collector of the power switch transistor oscillates and decreases; in the second period, the main control unit is configured to output a first control signal to the driving unit, such that the power switch transistor works under the second driving voltage, and configured to output a third control signal to the driving and transforming unit, such that the driving and transforming unit stops working.

In detail, the power switch transistor is an IGBT, the first control signal is a photoplethysmogram (PPG) pulse, the second control signal is a high level signal, and the third control signal is a low level signal.

According to some embodiments of the present disclosure, the driving and transforming unit includes: a first resistor, in which a first end of the first resistor is coupled to the main control unit; a first transistor, in which a base of the first transistor is coupled to a second end of the first resistor, and an emitter of the first transistor is grounded; a second resistor, in which the second resistor is coupled between the base and the emitter of the first transistor; and a third resistor, in which a first end of the third resistor is coupled to a collector of the first transistor, and a second end of the third resistor is coupled to the driving end of the power switch transistor.

In addition, the driving unit includes: a fourth resistor, in which a first end of the fourth resistor is coupled to the main control unit; a fifth resistor, in which a first end of the fifth resistor is coupled to the first end of the fourth resistor and the main control unit respectively, and a second end of the fifth resistor is grounded; a second transistor, in which a base of the second transistor is coupled to a second end of the fourth resistor, an emitter of the second transistor is grounded, and a collector of the second transistor is coupled to a power source of a preset voltage via a sixth resistor; a third transistor, in which a base of the third transistor is coupled to the collector of the second transistor, an emitter of the third transistor is grounded, and a collector of the third transistor is coupled to the power source of the preset voltage via a seventh resistor; a fourth transistor, in which a base of the fourth transistor is coupled to the collector of the third transistor, and a collector of the fourth transistor is coupled to the power source of the preset voltage via an eighth resistor; a fifth transistor, in which a base of the fifth transistor is coupled to the base of the fourth transistor, and a collector of the fifth transistor is grounded; a ninth resistor, in which a first end of the ninth resistor is coupled to an emitter of the fifth transistor, and a second end of the ninth resistor is coupled to an emitter of the fourth transistor; and a tenth resistor, in which a first end of the tenth resistor is coupled to the emitter of the fourth transistor and the second end of the ninth resistor respectively, and a second end of the tenth resistor is coupled to the driving end of the power switch transistor.

According to some embodiments of the present disclosure, the heating control circuit of an electromagnetic heating apparatus further includes a first Zener diode and an eleventh resistor, in which an anode of the first Zener diode is coupled to an emitter of the IGBT and is grounded, a cathode of the first Zener diode is coupled to a gate of the IGBT, and the eleventh resistor and the first Zener diode are coupled in parallel.

To achieve above objectives, a second aspect of embodiments of the present disclosure provides a low power heating control method of an electromagnetic heating apparatus. The electromagnetic heating apparatus includes a resonance heating unit, a power switch transistor configured to control the resonance heating unit to perform resonance work, a driving unit configured to drive the power switch transistor to turn on or to turn off, and a driving and transforming unit configured to change a driving voltage of the power switch transistor. The method includes following acts: when a low power heating instruction is received, controlling the power switch transistor in a wave-losing manner such that the electromagnetic heating apparatus performs discontinuous heating; detecting a voltage zero-crossing signal of an alternating current power source input to the electromagnetic heating apparatus; when controlling the electromagnetic heating apparatus to switch from an interval of stop heating to an interval of heating, controlling the driving unit and the driving and transforming unit to make the power switch transistor work under a first driving voltage before a zero-crossing point of the alternating current power source judged according to the voltage zero-crossing signal, controlling the driving and transforming unit to stop working when a voltage of a collector of the power switch transistor oscillates to a minimum, and controlling the driving unit to make the power switch transistor work under a second driving voltage, in which the second driving voltage is larger than the first driving voltage.

With the low power heating control method of an electromagnetic heating apparatus according to the embodiments of the present disclosure, when the low power heating instruction is received, the power switch transistor is controlled in the wave-losing manner such that the electromagnetic heating apparatus performs discontinuous heating, when the electromagnetic heating apparatus is controlled to switch from the stop-heating interval to the heating interval, the driving unit and the driving and transforming unit are controlled to make the power switch transistor work under the driving of the first driving voltage before the zero-crossing point of the alternating current power source judged according to the voltage zero-crossing signal, the driving and transforming unit is controlled to stop working when the voltage of the collector of the power switch transistor oscillates to the minimum, and the driving unit is controlled to make the power switch transistor work under the second driving voltage, thus realizing starting and turn-on of the power switch transistor via a voltage-changing driving manner when the electromagnetic heating apparatus enters the heating interval, reducing an open current of the power switch transistor, and reducing the damage caused by hard turn-on of the power switch transistor, meanwhile, reducing noise of turn-on, avoiding a large heating emitted from the power switch transistor, improving operation reliability of the electromagnetic heating apparatus, and broadening a range of heating power of the electromagnetic heating apparatus.

According to some embodiments of the present disclosure, a working process of the power switch transistor includes a first period and a second period, in which, in the first period, an amplitude value of the first driving voltage remains constant or increases linearly, a pulse width of the first driving voltage increases progressively or is a constant width; in the second period, an amplitude value of the second driving voltage remains constant, a pulse width of the second driving voltage increases progressively or is a constant width.

In addition, in the first period, the power switch transistor works in an amplification state; in the second period, the power switch transistor works in a switch state.

According to some embodiments of the present disclosure, the voltage of the collector of the power switch transistor oscillates to the minimum at the zero-crossing point of the alternating current power source.

According to some embodiments of the present disclosure, in the first period, outputting a first control signal to the driving unit and outputting a second control signal to the driving and transforming unit, such that the power switch transistor works under the first driving voltage with a constant amplitude value, and the voltage of the collector of the power switch transistor oscillates and decreases; in the second period, outputting a first control signal to the driving unit, such that the power switch transistor works under the second driving voltage, and outputting a third control signal to the driving and transforming unit, such that the driving and transforming unit stops working.

Specifically, the first control signal is a PPG pulse, the second control signal is a high level signal, and the third control signal is a low level signal.

In addition, embodiments of the present disclosure further provide an electromagnetic heating apparatus, including the above-mentioned heating control circuit of an electromagnetic heating apparatus.

With the electromagnetic heating apparatus, the driving and transforming unit is added in the heating control circuit to change the driving voltage of the power switch transistor, such that starting and turn-on of the power switch transistor may be realised via a voltage-changing driving manner when the electromagnetic heating apparatus enters the heating interval, thus reducing an open current of the power switch transistor, and reducing the damage caused by hard turn-on of the power switch transistor, meanwhile, reducing noise of turn-on, avoiding a large heating emitted from the power switch transistor, improving operation reliability, and broadening a range of heating power.

DETAILED DESCRIPTION

Figure 1:
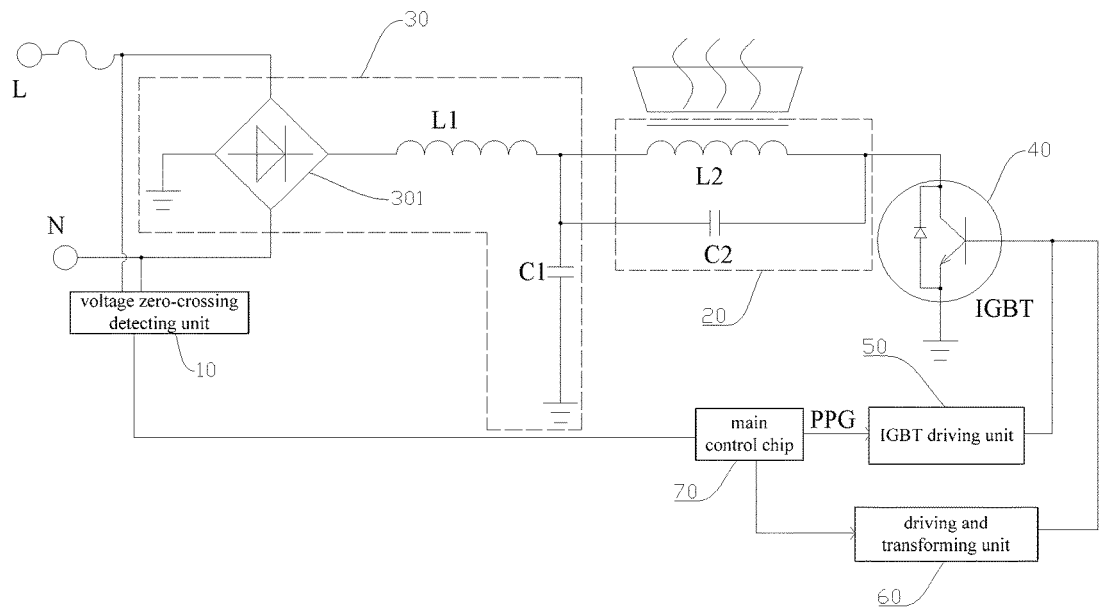
FIG. 1 is a schematic diagram illustrating a heating control circuit of an electromagnetic heating apparatus according to some embodiments of the present disclosure.

Reference will be made in detail to embodiments of the present disclosure. The same or similar elements and the elements having same or similar functions are denoted by like reference numerals throughout the descriptions. The embodiments described herein with reference to drawings are explanatory, illustrative, and used to generally understand the present disclosure. The embodiments shall not be construed to limit the present disclosure.

In the following, a heating control circuit of an electromagnetic heating apparatus, a low power heating control method of an electromagnetic heating apparatus and an electromagnetic heating apparatus provided according to embodiments of the present disclosure are described with reference to drawings.

FIG. 1 is a schematic diagram illustrating a heating control circuit of an electromagnetic heating apparatus according to some embodiments of the present disclosure. As illustrated in FIG. 1, the heating control circuit of an electromagnetic heating apparatus includes a voltage zero-crossing detecting unit 10, a resonance heating unit 20, a rectifier and filter unit 30, a power switch transistor 40, a driving unit 50, a driving and transforming unit 60, and a main control unit 70.

The voltage zero-crossing detecting unit 10 is configured to detect a voltage zero-crossing signal of an alternating current power source (L, N) input to the electromagnetic heating apparatus. For example, as illustrated in FIG. 1, the voltage zero-crossing detecting unit 10 is coupled to the alternating current power source (L, N). The rectifier and filter unit 30 is configured to perform rectifying and filtering on the alternating current power source which is provided to the resonance heating unit 20. As illustrated in FIG. 1, the rectifier and filter unit 30 includes a rectifier bridge 301, a filter inductor L1 and a filter capacitor C1. The resonance heating unit 20 includes a resonance coil L2 and a resonance capacitor C2. The resonance coil L2 and the resonance capacitor C2 are coupled in parallel. The power switch transistor 40 is configured to control the resonance heating unit 20 to perform resonance work, in which the power switch transistor 40 may be an IGBT, and a collector of the IGBT is coupled to the resonance coil L2 and the resonance capacitor C2 coupled in parallel.

As illustrated in FIG. 1, the driving unit 50 is coupled to a driving end of the power switch transistor 40 (such as a gate of the IGBT) so as to drive the power switch transistor 40 to turn on or to turn off. The driving and transforming unit 60 is coupled to the driving end of the power switch transistor 40 (such as the gate of the IGBT) so as to change a driving voltage of the power switch transistor 40. The main control unit 70, such as a main control chip, is coupled to the voltage zero-crossing detection unit 10, the driving unit 50, and the driving and transforming unit 60 respectively. The main control unit 70 controls the driving unit 50 and the driving and transforming unit 60 to make the power switch transistor 40 work under a first driving voltage V1 before a zero-crossing point of the alternating current power source judged according to the voltage zero-crossing signal. The main control unit 70 controls the driving and transforming unit 60 to stop working when a voltage of a collector of the power switch transistor 40 oscillates to a minimum, and controls the driving unit 50 to make the power switch transistor 40 work under a second driving voltage V2. The second driving voltage V2 is larger than the first driving voltage V1.

Figure 2:
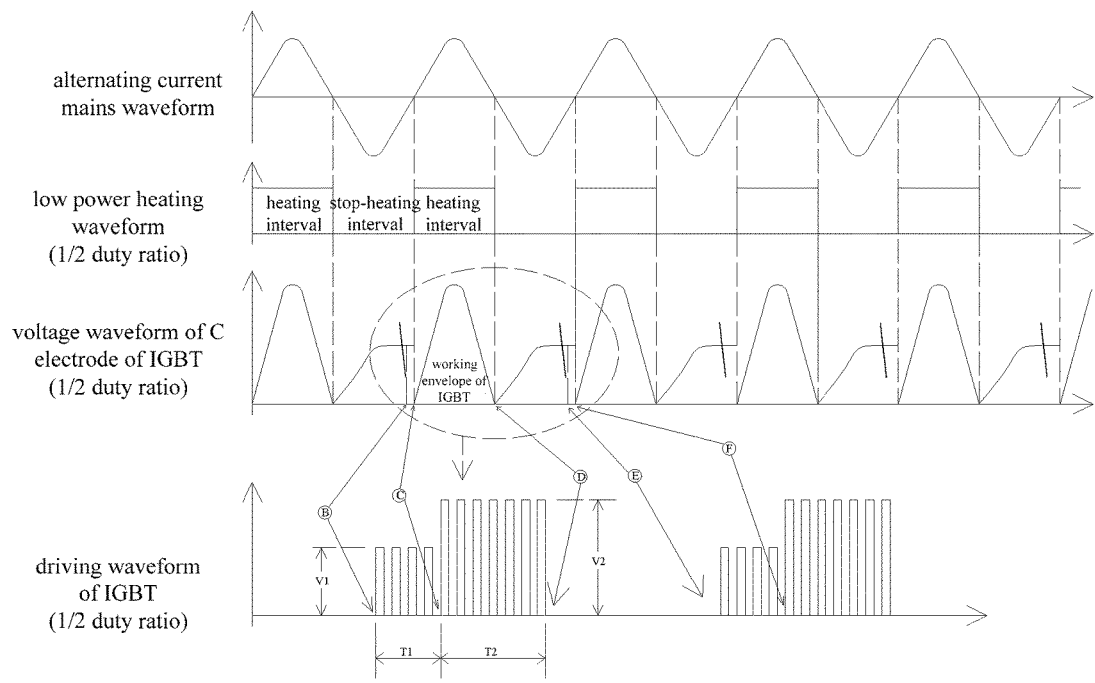
FIG. 2 is a schematic diagram illustrating a waveform of an electromagnetic heating apparatus operating with low power heating according to some embodiments of the present disclosure.

Further, according to some embodiments of the present disclosure, as illustrated in FIG. 2, which is a schematic diagram illustrating a waveform of an electromagnetic heating apparatus operating with low power heating, an alternating current mains waveform, a low power heating (for example, performing discontinuous heating in a wave-losing manner with a duty ratio of 1/2) waveform, a collector (C electrode) voltage waveform of the IGBT when the electromagnetic heating apparatus heating at a low power, a driving waveform of the IGBT are successively shown from top to bottom. The voltage waveforms of the C electrode of the IGBT corresponding to a stop-heating interval BC and a CD interval of heating stage refer to envelope waveforms formed by a peak voltage in an oscillating procedure of the voltage of the C electrode. It can be seen from FIG. 2, If the wave-losing manner, i.e., the discontinuous heating manner (for example, the duty ratio is 1/2) is used for the electromagnetic heating apparatus to perform the low power heating, when it is switched from the stop-heating interval to the heating interval, the main control unit 70 outputs a first control signal to the driving unit 50 and outputs a second control signal to the driving and transforming unit 60, so as to make the IGBT turn on or turn off under the driving of the first driving voltage, realizing oscillation of the voltage of the C electrode of the IGBT. When the voltage of the C electrode of the IGBT oscillates to the minimum, the main control unit 70 outputs a third control signal to the driving and transforming unit 60 at the same time when it outputs the first control signal to the driving unit 50, so as to make the IGBT turn on or turn off under the second driving voltage, thus realizing voltage-changing turn-on of the IGBT, that is, turning on the IGBT by changing the driving voltage of the IGBT.

Figure 3:
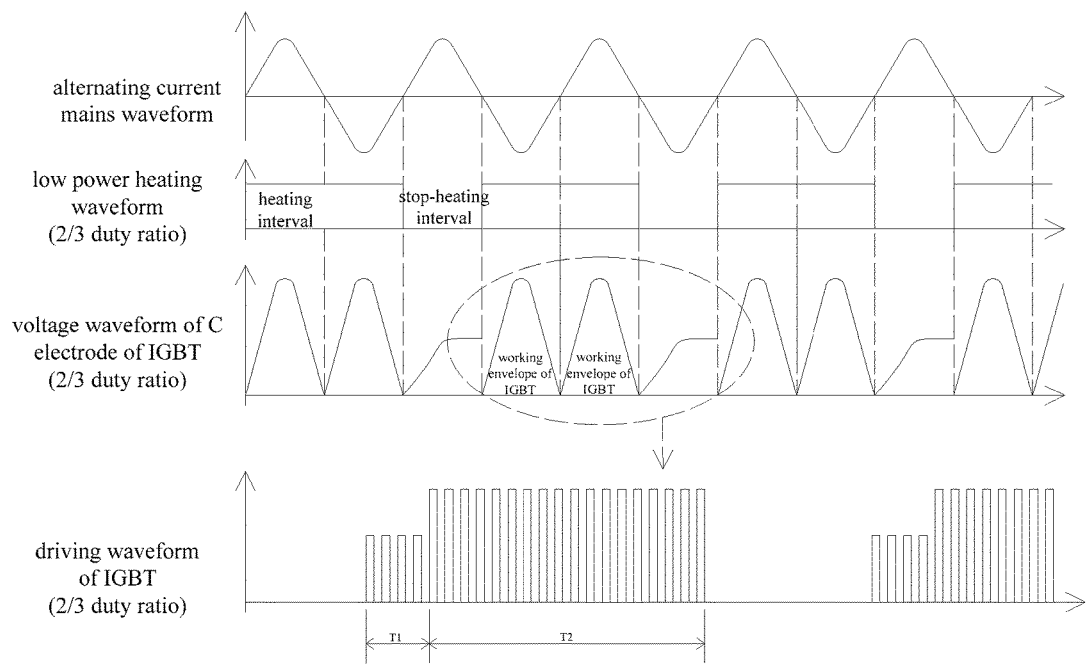
FIG. 3 is a schematic diagram illustrating a waveform of an electromagnetic heating apparatus operating with low power heating according to another embodiment of the present disclosure.

According to another embodiments of the present disclosure, as illustrated in FIG. 3, which is a schematic diagram illustrating a waveform of an electromagnetic heating apparatus operating with low power heating, an alternating current mains waveform, a low power heating (for example, performing discontinuous heating in a wave-losing manner with a duty ratio of 2/3) waveform, a voltage of the C electrode waveform of the IGBT when the electromagnetic heating apparatus heating at a low power, a driving waveform of the IGBT are successively shown from top to bottom. It can be seen from FIG. 3, If the wave-losing manner, i.e., the discontinuous heating manner (for example, the duty ratio is 2/3) is used for the electromagnetic heating apparatus to perform the low power heating, similarly, when it is switched from the stop-heating interval to the heating interval, the main control unit 70 outputs a first control signal to the driving unit 50 and outputs a second control signal to the driving and transforming unit 60, so as to make the IGBT turn on or turn off under the driving of the first driving voltage, realizing oscillation of the voltage of the C electrode of the IGBT. When the voltage of the C electrode of the IGBT oscillates to the minimum, the main control unit 70 outputs a third control signal to the driving and transforming unit 60 at the same time when it outputs the first control signal to the driving unit 50, so as to make the IGBT turn on or turn off under the second driving voltage, thus realizing the voltage-changing turn-on of the IGBT, that is, turning on the IGBT by changing the driving voltage of the IGBT.

Figure 4A:
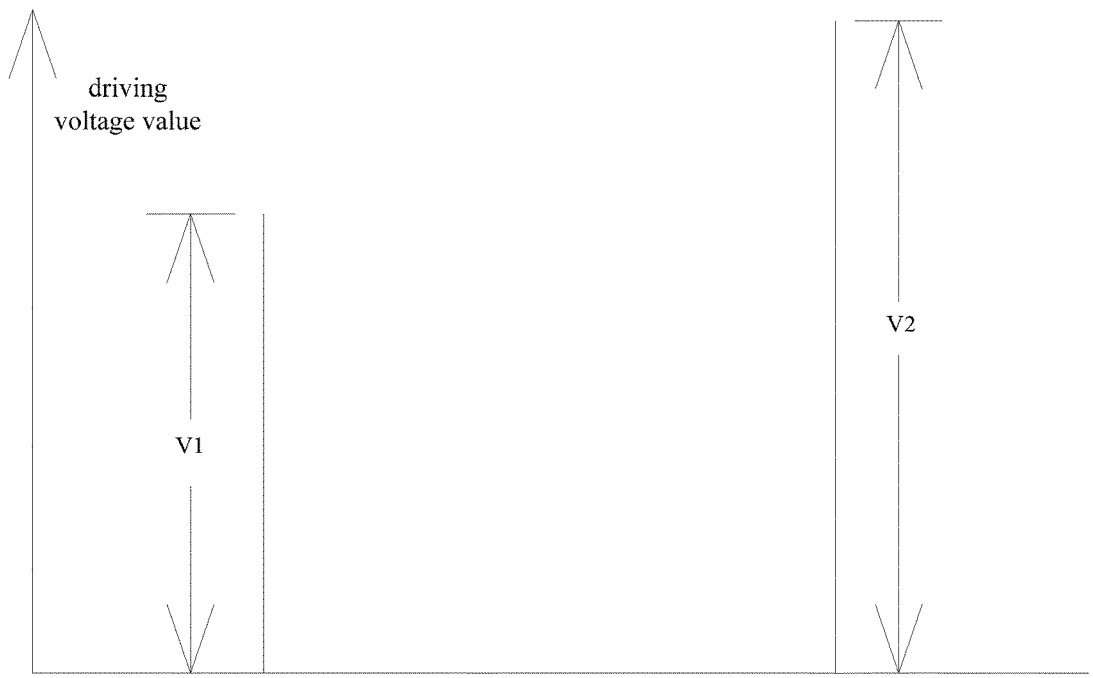
FIG. 4A is a schematic diagram illustrating changes of a first driving voltage V1 and a second driving voltage V2 according to some embodiments of the present disclosure.
Figure 4B:
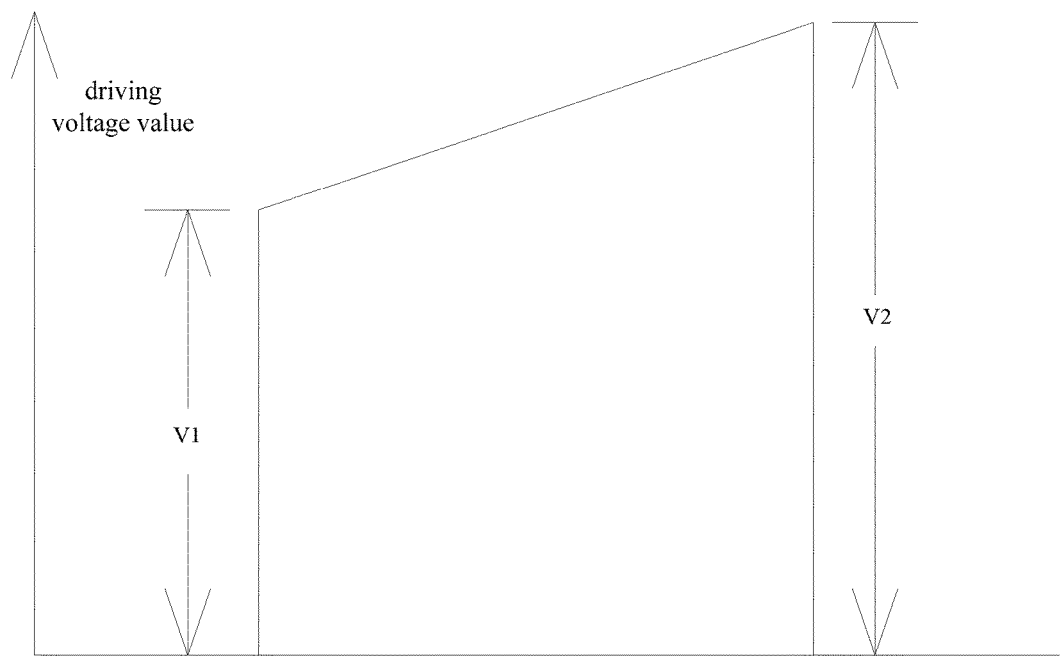
FIG. 4B is a schematic diagram illustrating changes of a first driving voltage V1 and a second driving voltage V2 according to another embodiment of the present disclosure.

As illustrated in FIG. 2 or 3, a working process of the power switch transistor 40 (such as the IGBT) includes a first period T1 and a second period T2. In the first period T1, an amplitude value of the first driving voltage V1 remains constant or increases linearly, and a pulse width of the first driving voltage V1 increases progressively or is a constant width. In the second period T2, an amplitude value of the second driving voltage V2 remains constant, and a pulse width of the second driving voltage V2 increases progressively or is a constant width. In other words, according to an effect of the driving unit 50 and the driving and transforming unit 60, the driving voltage of the IGBT may be changed from V1 with a constant amplitude value to V2 with a constant amplitude value, as illustrated in FIG. 4A, may also be changed linearly from V1 to V2, as illustrated in FIG. 4B, or, the driving voltage of the IGBT may be a changed value of a plurality of points between V1 and V2. In addition, by controlling the pulse widths of the first driving voltage and the second driving voltage to increase progressively or to be constant widths, current of the IGBT is gently controlled, thus reducing impulse current of the IGBT as much as possible, avoiding damage to the IGBT.

In addition, when the driving voltage of the gate of the IGBT is V1, the IGBT works in an amplification state, that is, in the first period T1, the power switch transistor, such as the IGBT, works in the amplification state. When the driving voltage of the gate of the IGBT is V2, the IGBT works in a switch state, that is, in the second period T2, the power switch transistor, such as the IGBT, works in the switch state. When the driving voltage of the gate of the IGBT is V1, the IGBT works in an amplification state, at this time, a current passing through the IGBT is related to the size of the driving voltage V1.

In embodiments of the present disclosure, as illustrated in FIG. 2 or 3, the voltage of the collector of the power switch transistor, such as the IGBT, oscillates to the minimum at the zero-crossing point of the alternating current power source.

In detail, in the first period T1, the main control unit 70 outputs a first control signal to the driving unit 50 and to output a second control signal to the driving and transforming unit 60, such that the power switch transistor works under the first driving voltage V1 with a constant amplitude value. The voltage of the collector of the power switch transistor oscillates and decreases. In the second period T2, the main control unit 70 outputs a first control signal to the driving unit 50, such that the power switch transistor works under the second driving voltage V2, at the same time, outputs a third control signal to the driving and transforming unit 60. A transistor in the driving and transforming unit 60 is turned off, such that the driving and transforming unit stops working.

According to some embodiments of the present disclosure, the first control signal is a PPG pulse, the second control signal may be a high level signal, and the third control signal may be a low level signal.

Figure 5:
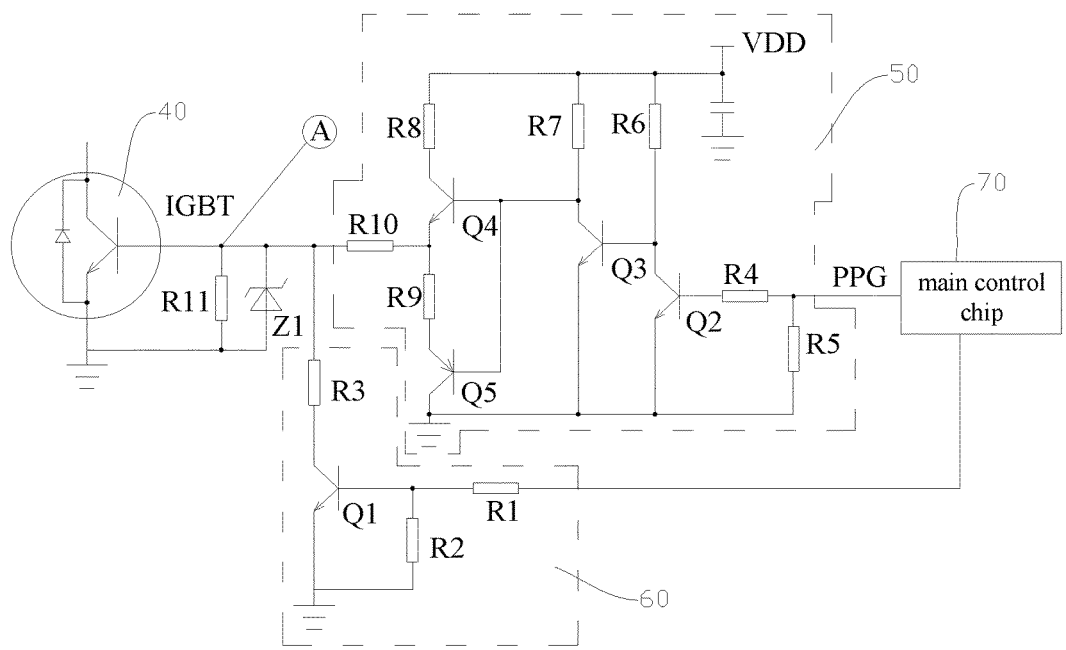
FIG. 5 is a circuit schematic diagram illustrating a driving unit and a driving and transforming unit according to a particular embodiment of the present disclosure.

In detail, as illustrated in FIG. 5, the driving and transforming unit 60 includes a first resistor R1, a first transistor Q1, a second resistor R2, and a third resistor R3. A first end of the first resistor R1 is coupled to the main control unit 70. A base of the first transistor Q1 is coupled to a second end of the first resistor R1, and an emitter of the first transistor Q1 is grounded. The second resistor R2 is coupled between the base and the emitter of the first transistor Q1. A first end of the third resistor R3 is coupled to a collector of the first transistor Q1, and a second end of the third resistor R3 is coupled to the driving end of the power switch transistor, such as the gate of the IGBT.

In addition, as illustrated in FIG. 5, the driving unit 50 includes a fourth resistor R4, a fifth resistor R5, a sixth resistor R6, a seventh resistor R7, an eighth resistor R8, a ninth resistor R9, a tenth resistor R10, a second transistor Q2, a third transistor Q3, a fourth transistor Q4, a fifth transistor Q5. A first end of the fourth resistor R4 is coupled to the main control unit 70. A first end of the fifth resistor R5 is coupled to the first end of the fourth resistor R4 and the main control unit 70 respectively, and a second end of the fifth resistor R5 is grounded. A base of the second transistor Q2 is coupled to a second end of the fourth resistor R4, an emitter of the second transistor Q2 is grounded, and a collector of the second transistor Q2 is coupled to a power source VDD of a preset voltage via the sixth resistor R6. A base of the third transistor Q3 is coupled to the collector of the second transistor Q2, an emitter of the third transistor Q3 is grounded, and a collector of the third transistor Q3 is coupled to the power source VDD of the preset voltage via the seventh resistor R7. A base of the fourth transistor Q4 is coupled to the collector of the third transistor Q3, and a collector of the fourth transistor Q4 is coupled to the power source VDD of the preset voltage via the eighth resistor R8. A base of the fifth transistor Q5 is coupled to the base of the fourth transistor Q4, and a collector of the fifth transistor Q5 is grounded. A first end of the ninth resistor R9 is coupled to an emitter of the fifth transistor Q5, and a second end of the ninth resistor R9 is coupled to an emitter of the fourth transistor Q4. A first end of the tenth resistor R10 is coupled to the emitter of the fourth transistor Q4 and the second end of the ninth resistor R9 respectively, and a second end of the tenth resistor R10 is coupled to the driving end of the power switch transistor 40, such as the gate of the IGBT.

In detail, in embodiments of the present disclosure, by adding the driving and transforming unit 60, i.e., adding the resistors R1, R2, R3 and the third transistor Q3, when the IGBT is controlled to start and turn on such that the electromagnetic heating apparatus performs heating, the main control chip sends a PPG pulse to the driving unit 50 in the first period T1, and sends the high level signal to the first resistor R1 to turn on Q1, at this time, a driving voltage at point A is V1, the IGBT turns on or off under the driving of V1 because of voltage division of the resistor R3, such that the voltage of the C electrode of the IGBT oscillates. In the second period T2, the main control chip sends a PPG pulse to the driving unit 50, and sends the low level signal to the first resistor R1 to turn off Q1, the driving and transforming unit 60 stops impacting on the driving voltage of the IGBT, at this time, the driving voltage at point A is V2, and the electromagnetic heating apparatus performs heating with the driving voltage of the IGBT remaining at a level of V2 in the second period.

Therefore, with the heating control circuit of an electromagnetic heating apparatus according to embodiments of the present disclosure, by adding the driving and transforming unit 60, the IGBT is driven to work by the first driving voltage V1 in the starting T1 period, and is driven to work by the second driving voltage V2 in the T2 period. When the IGBT is turned on, because of existence of the filter capacitor C1, the voltage of C electrode of the IGBT is a voltage value obtained by rectifying and filtering the alternating current power source rather than 0, which is about 1.4 times of the voltage of the alternating current power source. When the driving voltage of the IGBT is V1, the IGBT works in the amplification state, at this time, a value of a current passing through the IGBT is much less than a current value in the switch state of the IGBT driven under a voltage condition of V2, that is, an amplified current passing through the IGBT is much less than a switch current. Therefore, in the present disclosure, by using the voltage-changing turn-on of the IGBT, the turn-on current of the IGBT is reduced, reducing the damage caused by hard turn-on of the IGBT, and reducing turn-on noise of the IGBT at the same time.

According to some embodiments of the present disclosure, as illustrated in FIG. 5, the above-mentioned heating control circuit of an electromagnetic heating apparatus further includes a first Zener diode Z1 and an eleventh resistor R11. An anode of the first Zener diode Z1 is coupled to an emitter of the IGBT and is grounded, a cathode of the first Zener diode Z1 is coupled to a gate of the IGBT, and the eleventh resistor R11 and the first Zener diode Z1 are coupled in parallel.

In embodiments of the present disclosure, the electromagnetic heating apparatus may be electromagnetic products such as an electromagnetic oven, an electromagnetic pressure cooker, an electromagnetic rice cooker, or the like.

With the heating control circuit of an electromagnetic heating apparatus according to the embodiments of the present disclosure, the driving and transforming unit is added to change the driving voltage of the power switch transistor, such that the main control unit controls the driving unit and the driving and transforming unit to make the power switch transistor work under the driving of the first driving voltage before the zero-crossing point of the alternating current power source judged according to the voltage zero-crossing signal, and controls the driving and transforming unit to stop working when the voltage of the collector of the power switch transistor oscillates to the minimum, and controls the driving unit to make the power switch transistor work under the second driving voltage, thus realizing starting and turn-on of the power switch transistor via a voltage-changing driving manner when the electromagnetic heating apparatus is working, reducing an open current of the power switch transistor, and reducing the damage caused by hard turn-on of the power switch transistor, meanwhile, reducing noise of turn-on, avoiding a large heating emitted from the power switch transistor, improving operation reliability of the electromagnetic heating apparatus, and broadening a range of heating power of the electromagnetic heating apparatus.

Figure 6:
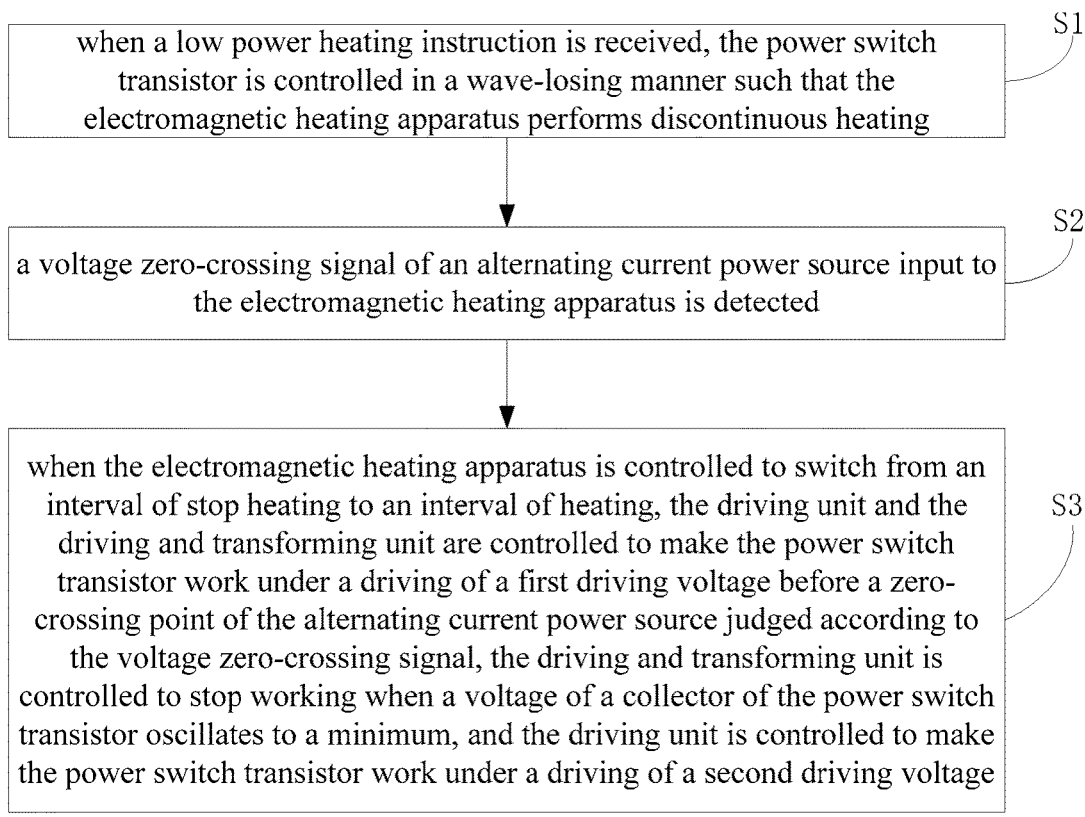
FIG. 6 is a flow chart of a low power heating control method of an electromagnetic heating apparatus according to embodiments of the present disclosure.

FIG. 6 is a flow chart of a low power heating control method of an electromagnetic heating apparatus according to embodiments of the present disclosure. The electromagnetic heating apparatus includes a resonance heating unit, a power switch transistor configured to control the resonance heating unit to perform resonance work, a driving unit configured to drive the power switch transistor to turn on or to turn off, and a driving and transforming unit configured to change a driving voltage of the power switch transistor. As illustrated in FIG. 6, the low power heating control method of an electromagnetic heating apparatus includes following acts.

At block S1, when a low power heating instruction is received, the power switch transistor is controlled in a wave-losing manner such that the electromagnetic heating apparatus performs discontinuous heating.

According to some embodiments of the present disclosure, as illustrated in FIG. 2 or 3, the wave-losing manner may be used to control the electromagnetic heating apparatus to perform low power heating, with a duty ratio of 1/2 or 1/3. For example, when a heating power is lower than or equal to 1000 W, the main control chip defaults to be in a low power state, otherwise to be in a high power state. When a user controls the electromagnetic heating apparatus to operate with a certain low power (for example 600W) heating, the main control chip uses the wave-losing manner for processing, abandoning 1/2 or 1/3 of waveform of an alternating current power source to realize the low power heating of the electromagnetic heating apparatus.

At block S2, a voltage zero-crossing signal of an alternating current power source input to the electromagnetic heating apparatus is detected. For example, the voltage zero-crossing signal of the alternating current power source may be detected by a voltage zero-crossing detecting unit.

At block S3, when the electromagnetic heating apparatus is controlled to switch from an interval of stop heating to an interval of heating, the driving unit and the driving and transforming unit are controlled to make the power switch transistor work under a first driving voltage before a zero-crossing point of the alternating current power source judged according to the voltage zero-crossing signal, the driving and transforming unit is controlled to stop working when a voltage of a collector of the power switch transistor oscillates to a minimum, and the driving unit is controlled to make the power switch transistor work under a second driving voltage, in which the second driving voltage is larger than the first driving voltage. That is, each time it switches from the stop-heating interval to the heating interval, a manner of changing the driving voltage of the power switch transistor, such as the IGBT, is used to turn on the IGBT to performing heating, which can reduce the impulse current of the IGBT, and reduce switch noise.

According to some embodiments of the present disclosure, as illustrated in FIG. 2 or 3, a working process of the power switch transistor, such as the IGBT, includes a first period T1 and a second period T2. In the first period T1, an amplitude value of the first driving voltage V1 remains constant or increases linearly, and a pulse width of the first driving voltage V1 increases progressively or is a constant width. In the second period T2, an amplitude value of the second driving voltage V2 remains constant, and a pulse width of the second driving voltage V2 increases progressively or is a constant width. In other words, according to an effect of the driving unit 50 and the driving and transforming unit 60, the driving voltage of the IGBT may be changed from V1 with a constant amplitude value to V2 with a constant amplitude value, as illustrated in FIG. 4A, may also be changed linearly from V1 to V2, as illustrated in FIG. 4B, or the driving voltage of the IGBT may be a changed value of a plurality of points between V1 and V2. In addition, by controlling the pulse widths of the first driving voltage and the second driving voltage to increase progressively or to be constant widths, current of the IGBT is gently controlled, thus reducing impulse current of the IGBT as much as possible, avoiding damage to the IGBT.

In addition, when the driving voltage of the gate of the IGBT is V1, the IGBT works in an amplification state, that is, in the first period T1, the power switch transistor, such as the IGBT, works in the amplification state. When the driving voltage of the gate of the IGBT is V2, the IGBT works in a switch state, that is, in the second period T2, the power switch transistor, such as the IGBT, works in the switch state. When the driving voltage of the gate of the IGBT is V1, the IGBT works in an amplification state, at this time, a current passing through the IGBT is related to the size of the driving voltage V1.

In embodiments of the present disclosure, as illustrated in FIG. 2 or 3, the voltage of the collector of the power switch transistor, such as the IGBT, oscillates to the minimum at the zero-crossing point of the alternating current power source.

In detail, in the first period T1, a first control signal is outputted to the driving unit and a second control signal is outputted to the driving and transforming unit, such that the power switch transistor works under the first driving voltage V1 with a constant amplitude value. The voltage of the collector of the power switch transistor oscillates and decreases. In the second period T2, a first control signal is outputted to the driving unit, such that the power switch transistor works under the second driving voltage V2, at the same time, a third control signal is outputted to the driving and transforming unit. A transistor in the driving and transforming unit is turned off, such that the driving and transforming unit stops working.

According to some embodiments of the present disclosure, the first control signal is a PPG pulse, the second control signal may be a high level signal, and the third control signal may be a low level signal.

In other words, in embodiments of the present disclosure, when the electromagnetic heating apparatus is controlled to operate with a certain heating power, for example 600W, the discontinuous heating manner is used to realize the low power heating. In the stop-heating interval, because of existence of the filter capacitor C1, the voltage of C electrode of the IGBT remains at a voltage value obtained by rectifying and filtering the alternating current power source. When starting at point B before the voltage zero-crossing point of the alternating current power source, the driving voltage V1 is used to turn on the IGBT, a plurality of PPG pulses makes an oscillating circuit generate oscillation, and the voltage of the C electrode of the IGBT oscillates and decreases. An amplitude value of a driving pulse of the IGBT is V1, and a pulse width of the driving pulse of the IGBT is a pulse width of the PPG. It can be set that width of the PPG is constant or increases regularly, after a plurality of oscillations, when the voltage zero-crossing point C is reached, i.e., when the voltage of the C electrode of the IGBT oscillates to the minimum, a voltage of the capacitor C1 is close to 0V, at this time, the starting stage T1 ends, and T2 stage begins, the driving voltage of the IGBT is changed to V2, the IGBT is in a normal switch state. Hereafter, the driving voltage of the IGBT remains V2, with a pulse width remaining constant or regularly increasing or decreasing. When a next zero-crossing point D is reached, driving of the IGBT is turned off.

Therefore, when the wave-losing manner is used to control the electromagnetic heating apparatus to perform low power heating, a manner of changing starting voltage of the IGBT is used to start the IGBT for heating. In a stage (T1 stage) of starting the IGBT, the amplitude value of the driving voltage of the IGBT is constant or changeable, and the pulse width is constant or increases regularly. In the formal heating stage (T2 stage), the amplitude value of the driving voltage of the IGBT is always V2, and the pulse width is constant or regularly increases or decreases. Starting point of the IGBT is before the voltage zero-crossing point of the alternating current power source, such that it can ensure the voltage of the capacitor C1 may be reduced to the minimum, i.e., the voltage of the C electrode oscillates to close to 0V, when the voltage of the alternating current power source crosses zero. At the same time, the driving voltage of the IGBT is V2 after the voltage zero-crossing point of the alternating current power source, therefore, such that the open current of the IGBT may be reduced, the damage caused by hard turn-on of the IGBT may be reduced, and noise of turning on the IGBT may be reduced.

With the low power heating control method of an electromagnetic heating apparatus according to the embodiments of the present disclosure, when the low power heating instruction is received, the power switch transistor is controlled in the wave-losing manner such that the electromagnetic heating apparatus performs discontinuous heating, when the electromagnetic heating apparatus is controlled to switch from the stop-heating interval to the heating interval, the driving unit and the driving and transforming unit are controlled to make the power switch transistor work under the driving of the first driving voltage before the zero-crossing point of the alternating current power source judged according to the voltage zero-crossing signal, the driving and transforming unit is controlled to stop working when the voltage of the collector of the power switch transistor oscillates to the minimum, and the driving unit is controlled to make the power switch transistor work under the second driving voltage, thus realizing starting and turn-on of the power switch transistor via a voltage-changing driving manner when the electromagnetic heating apparatus enters the heating interval, reducing an open current of the power switch transistor, reducing the damage caused by hard turn-on of the power switch transistor, meanwhile, meanwhile, reducing noise of turn-on, avoiding a large heating emitted from the power switch transistor, improving operation reliability of the electromagnetic heating apparatus, and broadening a range of heating power of the electromagnetic heating apparatus.

In addition, embodiments of the present disclosure further provide an electromagnetic heating apparatus, including the above-mentioned heating control circuit of an electromagnetic heating apparatus.

With the electromagnetic heating apparatus, the driving and transforming unit is added in the heating control circuit to change the driving voltage of the power switch transistor, such that starting and turn-on of the power switch transistor may be realised via a voltage-changing driving manner when the electromagnetic heating apparatus enters the heating interval, thus reducing an open current of the power switch transistor, and reducing the damage caused by hard turn-on of the power switch transistor, meanwhile, reducing noise of turn-on, avoiding a large heating emitted from the power switch transistor, improving operation reliability, and broadening a range of heating power.

In the specification, it is to be understood that terms such as "central," "longitudinal," "lateral," "length," "width," "thickness," "upper," "lower," "front," "rear," "left," "right," "vertical," "horizontal," "top," "bottom," "inner," "outer," "clockwise," and "counterclockwise" should be construed to refer to the orientation as then described or as shown in the drawings under discussion. These relative terms are for convenience of description and do not require that the present disclosure be constructed or operated in a particular orientation.

In addition, terms such as "first" and "second" are used herein for purposes of description and are not intended to indicate or imply relative importance or significance. Thus, the feature defined with "first" and "second" may comprise one or more this feature. In the description of the present disclosure, "a plurality of" means two or more than two, for example, two or three, unless specified otherwise.

In the present disclosure, unless specified or limited otherwise, the terms "mounted", "connected", "coupled", "fixed" and the like are used broadly, and may be, for example, fixed connections, detachable connections, or integral connections; may also be mechanical or electrical connections; may also be direct connections or indirect connections via intervening structures; may also be inner communications of two elements, which can be understood by those skilled in the art according to specific situations.

In the present disclosure, unless specified or limited otherwise, a structure in which a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature; while a first feature "below," "under," or "on bottom of" a second feature may include an embodiment in which the first feature is right or obliquely "below," "under," or "on bottom of" the second feature, or just means that the first feature is at a height lower than that of the second feature.

Reference throughout this specification to "an embodiment," "some embodiments," "an example," "a specific example," or "some examples," means that a particular feature, structure, material, or characteristic described in connection with the embodiment or example is included in at least one embodiment or example of the present disclosure. Thus, the appearances of the phrases such as "in some embodiments," "in one embodiment", "in an embodiment", "in another example," "in an example," "in a specific example," or "in some examples," in various places throughout this specification are not necessarily referring to the same embodiment or example of the present disclosure. Furthermore, the particular features, structures, materials, or characteristics may be combined in any suitable manner in one or more embodiments or examples. In addition, in the absence of contradiction, those skilled in the art can combine the different embodiments or examples described in this specification, or combine the features of different embodiments or examples.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the present disclosure.

What is claimed is:

1. A heating control circuit of an electromagnetic heating apparatus, comprising:
   a voltage zero-crossing detecting unit configured to detect a voltage zero-crossing signal of an alternating current power source input to the electromagnetic heating apparatus;
   a resonance heating unit;
   a rectifier and filter unit configured to perform rectifying and filtering on the alternating current power source which is provided to the resonance heating unit;
   a power switch transistor configured to control the resonance heating unit to perform resonance work;
   a driving unit, wherein the driving unit is coupled to a driving end of the power switch transistor so as to drive the power switch transistor to turn on or to turn off;
   a driving and transforming unit, wherein the driving and transforming unit is coupled to the driving end of the power switch transistor so as to change a driving voltage of the power switch transistor; and a main control unit, wherein the main control unit is coupled to the voltage zero-crossing detection unit, the driving unit, and the driving and transforming unit respectively, and the main control unit is configured to control the driving unit and the driving and transforming unit to make the power switch transistor work under a first driving voltage before a zero-crossing point of the alternating current power source judged according to the voltage zero-crossing signal, to control the driving and transforming unit to stop working when a voltage of a collector of the power switch transistor oscillates to a minimum, and to control the driving unit to make the power switch transistor work under a second driving voltage, wherein the second driving voltage is larger than the first driving voltage.

2. The heating control circuit of the electromagnetic heating apparatus according to claim 1, wherein a working process of the power switch transistor comprises a first period and a second period, wherein, in the first period, an amplitude value of the first driving voltage remains constant or increases linearly, a pulse width of the first driving voltage increases progressively or is a constant width; and in the second period, an amplitude value of the second driving voltage remains constant, a pulse width of the second driving voltage increases progressively or is a constant width.

3. The heating control circuit of the electromagnetic heating apparatus according to claim 2, wherein, in the first period, the power switch transistor works in an amplification state; in the second period, the power switch transistor works in a switch state.

4. The heating control circuit of the electromagnetic heating apparatus according to claim 2, wherein, in the first period, the main control unit is configured to output a first control signal to the driving unit and to output a second control signal to the driving and transforming unit, such that the power switch transistor works under the first driving voltage with a constant amplitude value, and the voltage of the collector of the power switch transistor oscillates and decreases;

in the second period, the main control unit is configured to output a first control signal to the driving unit, such that the power switch transistor works under the second driving voltage, and configured to output a third control signal to the driving and transforming unit, such that the driving and transforming unit stops working.

5. The heating control circuit of the electromagnetic heating apparatus according to claim 4, wherein the power switch transistor is an insulated gate pipolar transistor (IGBT), the first control signal is a photoplethysmogram (PPG) pulse, the second control signal is a high level signal, and the third control signal is a low level signal.

6. The heating control circuit of the electromagnetic heating apparatus according to claim 1, wherein the driving and transforming unit further comprises:

a first resistor, wherein a first end of the first resistor is coupled to the main control unit;

a first transistor, wherein a base of the first transistor is coupled to a second end of the first resistor, and an emitter of the first transistor is grounded;

a second resistor, wherein the second resistor is coupled between the base and the emitter of the first transistor; and a third resistor, wherein a first end of the third resistor is coupled to a collector of the first transistor, and a second end of the third resistor is coupled to the driving end of the power switch transistor.

7. The heating control circuit of the electromagnetic heating apparatus according to claim 6, wherein the driving unit further comprises:

a fourth resistor, wherein a first end of the fourth resistor is coupled to the main control unit;

a fifth resistor, wherein a first end of the fifth resistor is coupled to the first end of the fourth resistor and the main control unit respectively, and a second end of the fifth resistor is grounded;

a second transistor, wherein a base of the second transistor is coupled to a second end of the fourth resistor, an emitter of the second transistor is grounded, and a collector of the second transistor is coupled to a power source of a preset voltage via a sixth resistor;

a third transistor, wherein a base of the third transistor is coupled to the collector of the second transistor, an emitter of the third transistor is grounded, and a collector of the third transistor is coupled to the power source of the preset voltage via a seventh resistor;

a fourth transistor, wherein a base of the fourth transistor is coupled to the collector of the third transistor, and a collector of the fourth transistor is coupled to the power source of the preset voltage via an eighth resistor;

a fifth transistor, wherein a base of the fifth transistor is coupled to the base of the fourth transistor, and a collector of the fifth transistor is grounded;

a ninth resistor, wherein a first end of the ninth resistor is coupled to an emitter of the fifth transistor, and a second end of the ninth resistor is coupled to an emitter of the fourth transistor; and a tenth resistor, wherein a first end of the tenth resistor is coupled to the emitter of the fourth transistor and the second end of the ninth resistor respectively, and a second end of the tenth resistor is coupled to the driving end of the power switch transistor.

8. The heating control circuit of the electromagnetic heating apparatus according to claim 5, further comprising a first Zener diode and an eleventh resistor, wherein an anode of the first Zener diode is coupled to an emitter of the IGBT and is grounded, a cathode of the first Zener diode is coupled to a gate of the IGBT, and the eleventh resistor and the first Zener diode are coupled in parallel.

9. The heating control circuit of the electromagnetic heating apparatus according to claim 1, wherein the voltage of the collector of the power switch transistor oscillates to the minimum at the zero-crossing point of the alternating current power source.

10. An electromagnetic heating apparatus, comprising a heating control circuit, wherein the heating control circuit further comprises:

a voltage zero-crossing detecting unit configured to detect a voltage zero-crossing signal of an alternating current power source input to the electromagnetic heating apparatus;

a resonance heating unit;

a rectifier and filter unit configured to perform rectifying and filtering on the alternating current power source which is provided to the resonance heating unit;

a power switch transistor configured to control the resonance heating unit to perform resonance work;

a driving unit, wherein the driving unit is coupled to a driving end of the power switch transistor so as to drive the power switch transistor to turn on or to turn off;

a driving and transforming unit, wherein the driving and transforming unit is coupled to the driving end of the power switch transistor so as to change a driving voltage of the power switch transistor; and a main control unit, wherein the main control unit is coupled to the voltage zero-crossing detection unit, the driving unit, and the driving and transforming unit respectively, and the main control unit is configured to control the driving unit and the driving and transforming unit to make the power switch transistor work under a first driving voltage before a zero-crossing point of the alternating current power source judged according to the voltage zero-crossing signal, to control the driving and transforming unit to stop working when a voltage of a collector of the power switch transistor oscillates to a minimum, and to control the driving unit to make the power switch transistor work under a second driving voltage, wherein the second driving voltage is larger than the first driving voltage.

11. A low power heating control method of an electromagnetic heating apparatus, wherein the electromagnetic heating apparatus comprises a resonance heating unit, a power switch transistor configured to control the resonance heating unit to perform resonance work, a driving unit configured to drive the power switch transistor to turn on or off, and a driving and transforming unit configured to change a driving voltage of the power switch transistor, the method further comprising:

in response to receiving a low power heating instruction, controlling the power switch transistor in a wave-losing manner such that the electromagnetic heating apparatus performs discontinuous heating;

detecting a voltage zero-crossing signal of an alternating current power source input to the electromagnetic heating apparatus; and when the electromagnetic heating apparatus is controlled to switch from a stop-heating interval to a heating interval, controlling the driving unit and the driving and transforming unit to make the power switch transistor work under a first driving voltage before a zero-crossing point of the alternating current power source judged according to the voltage zero-crossing signal, controlling the driving and transforming unit to stop working when a voltage of a collector of the power switch transistor oscillates to a minimum, and controlling the driving unit to make the power switch transistor work under a second driving voltage, wherein the second driving voltage is larger than the first driving voltage.

12. The method according to claim 11, wherein a working process of the power switch transistor comprises a first period and a second period, wherein, in the first period, an amplitude value of the first driving voltage remains constant or increases linearly, a pulse width of the first driving voltage increases progressively or is a constant width;

in the second period, an amplitude value of the second driving voltage remains constant, a pulse width of the second driving voltage increases progressively or is a constant width.

13. The method according to claim 12, wherein, in the first period, the power switch transistor works in an amplification state; in the second period, the power switch transistor works in a switch state.

14. The method according to claim 11, wherein the voltage of the collector of the power switch transistor oscillates to the minimum at the zero-crossing point of the alternating current power source.

15. The method according to claim 12, further comprising:

in the first period, outputting a first control signal to the driving unit and outputting a second control signal to the driving and transforming unit, such that the power switch transistor works under the first driving voltage with a constant amplitude value, and the voltage of the collector of the power switch transistor oscillates and decreases;

in the second period, outputting a first control signal to the driving unit, such that the power switch transistor works under the second driving voltage, and outputting a third control signal to the driving and transforming unit, such that the driving and transforming unit stops working.

16. The method according to claim 15, wherein the first control signal is a PPG pulse, the second control signal is a high level signal, and the third control signal is a low level signal.

* * * * *